(12) United States Patent
Wu

(10) Patent No.: US 8,441,964 B2
(45) Date of Patent: May 14, 2013

(54) FEEDING DEVICE FOR SMART ANTENNA

(75) Inventor: Min-Chung Wu, Taoyuan County (TW)

(73) Assignee: Ralink Technology Corp., Jhubei, Hsinchu County (TW)

( * ) Notice: Subject to any disclaimer, the term of this patent is extended or adjusted under 35 U.S.C. 154(b) by 376 days.

(21) Appl. No.: 12/895,769

(22) Filed: Sep. 30, 2010

(65) Prior Publication Data

US 2011/0193652 A1 Aug. 11, 2011

(30) Foreign Application Priority Data

Feb. 5, 2010 (TW) ................................ 99103491 A

(51) Int. Cl.
*H04B 7/00* (2006.01)
*H01P 1/00* (2006.01)
*H01Q 1/50* (2006.01)

(52) U.S. Cl.
USPC ........... 370/277; 313/105; 313/101; 370/276; 343/850; 343/876

(58) Field of Classification Search .......................... None
See application file for complete search history.

(56) References Cited

U.S. PATENT DOCUMENTS

| | | | | |
|---|---|---|---|---|
| 5,115,248 A | * | 5/1992 | Roederer | ....................... 342/373 |
| 5,736,963 A | * | 4/1998 | Roederer et al. | ............... 342/373 |
| 7,612,482 B2 | * | 11/2009 | Burger et al. | ................... 310/239 |
| 8,111,640 B2 | * | 2/2012 | Knox | .............................. 370/278 |
| 2009/0009391 A1 | * | 1/2009 | Fox et al. | ........................ 342/372 |
| 2011/0032159 A1 | * | 2/2011 | Wu et al. | ........................ 343/702 |
| 2012/0188917 A1 | * | 7/2012 | Knox | .............................. 370/277 |

FOREIGN PATENT DOCUMENTS

CN 101388492 A 3/2009

\* cited by examiner

*Primary Examiner* — Trinh Dinh
(74) *Attorney, Agent, or Firm* — Winston Hsu; Scott Margo

(57) ABSTRACT

A feeding device for a smart antenna includes a signal reception terminal, a first antenna feeding terminal, a second antenna feeding terminal, a power divider, and a switching circuit. The signal reception terminal is utilized for receiving a transmitting signal. The first antenna feeding terminal and the second antenna feeding terminal are utilized for outputting feeding signals to the two antennas, respectively. The power divider, having a first input port, a second input port, a first output port, and a second output port, is utilized for distributing energy received by the first input port or the second input port equally to the first output port and the second output port, and making signals of the first output port and the second output port having 90 degree phase difference. The switching circuit performs switching operations to control electrical connections of the power divider according to a control signal.

17 Claims, 6 Drawing Sheets

FEEDING DEVICE FOR SMART ANTENNA

RELATED APPLICATIONS

This application is based upon and claims the benefit of priority under 35 U.S.C. 119 from a TAWAIN Application No. 099103491 filed on Feb. 5, 2010, the content of which is incorporated herein by reference.

BACKGROUND OF THE INVENTION

1. Field of the Invention

The present invention relates to a feeding device for a smart antenna, and more particularly to a feeding device that outputs a plurality of different signals via switching of the switching circuit.

2. Description of the Prior Art

With the evolution of wireless communication technologies, quantity of antennas equipped within an electronic product increases. For example, standard of wireless local area network (WLAN) IEEE 802.11n supports multi-input multi-output (MIMO) communication technique; and thus a related electronic product may receive and transmit radio signals synchronously via multiple sets of antennas, to increase data throughput and transmission distance in a system without increasing bandwidth or transmit power expenditure. Such that spectrum efficiency and data rate of the system can be effectively enhanced, and communication quality can be improved as well.

In the prior art, each antenna of a MIMO system has a fixed polarization direction, and is unable to be adjusted based on system requirements. Under this condition, transmitters and receivers may have polarization loss due to antenna polarization mismatch, which results in poor transmission efficiency. Hence, if polarization directions of each antenna can be adaptively adjusted according to circumstances of the transmission environment, the polarization loss of each antenna would be minimized, and thereby the transmission efficiency can be maximized.

However, to achieve the goal that adequately adjusts the polarization direction of the antennas is bound to increase difficulties in designing an antenna feeding network. In the prior arts, multiple sets of feeding networks are used to have feeding signals outputted individually for supplying antennas of various polarization directions. In this way, the layout complexity of printed circuit boards and the size of electronic products are both increased.

SUMMARY OF THE INVENTION

It is therefore an objective of the claimed invention to provide a feeding device for a smart antenna.

The present invention discloses a feeding device for a smart antenna. The feeding device includes a signal reception terminal, a first antenna feeding terminal, a second antenna feeding terminal, a first impedance, a second impedance, a power divider, and a switching circuit. The signal reception terminal is utilized for receiving a transmission signal. The first antenna feeding terminal is utilized for outputting a first feeding signal to a first antenna. The second antenna feeding terminal is utilized for outputting a second feeding signal to a second antenna. The power divider, having a first input port, a second input port, a first output port, and a second output port, is utilized for distributing energy received by the first input port or the second input port equally to the first output port and the second output port and making signals of the first output port and the second output port have 90 degree phase difference. The switching circuit is utilized for switching connection states between the power divider and each one of the signal reception terminal, the first antenna feeding terminal, the second antenna feeding terminal, the first impedance and the second impedance according to a control signal.

These and other objectives of the present invention will no doubt become obvious to those of ordinary skill in the art after reading the following detailed description of the preferred embodiment that is illustrated in the various figures and drawings.

DETAILED DESCRIPTION

The present invention proposes a feeding device for a smart antenna that provides a variety of signal outputs via switching of the switching circuit. Arranging the feeding device with antennas could make the antennas have radiation electric fields of different polarization directions including horizontal linear polarization, vertical linear polarization, right-hand circular polarization, left-handed circularly polarization and so on.

Figure 1:
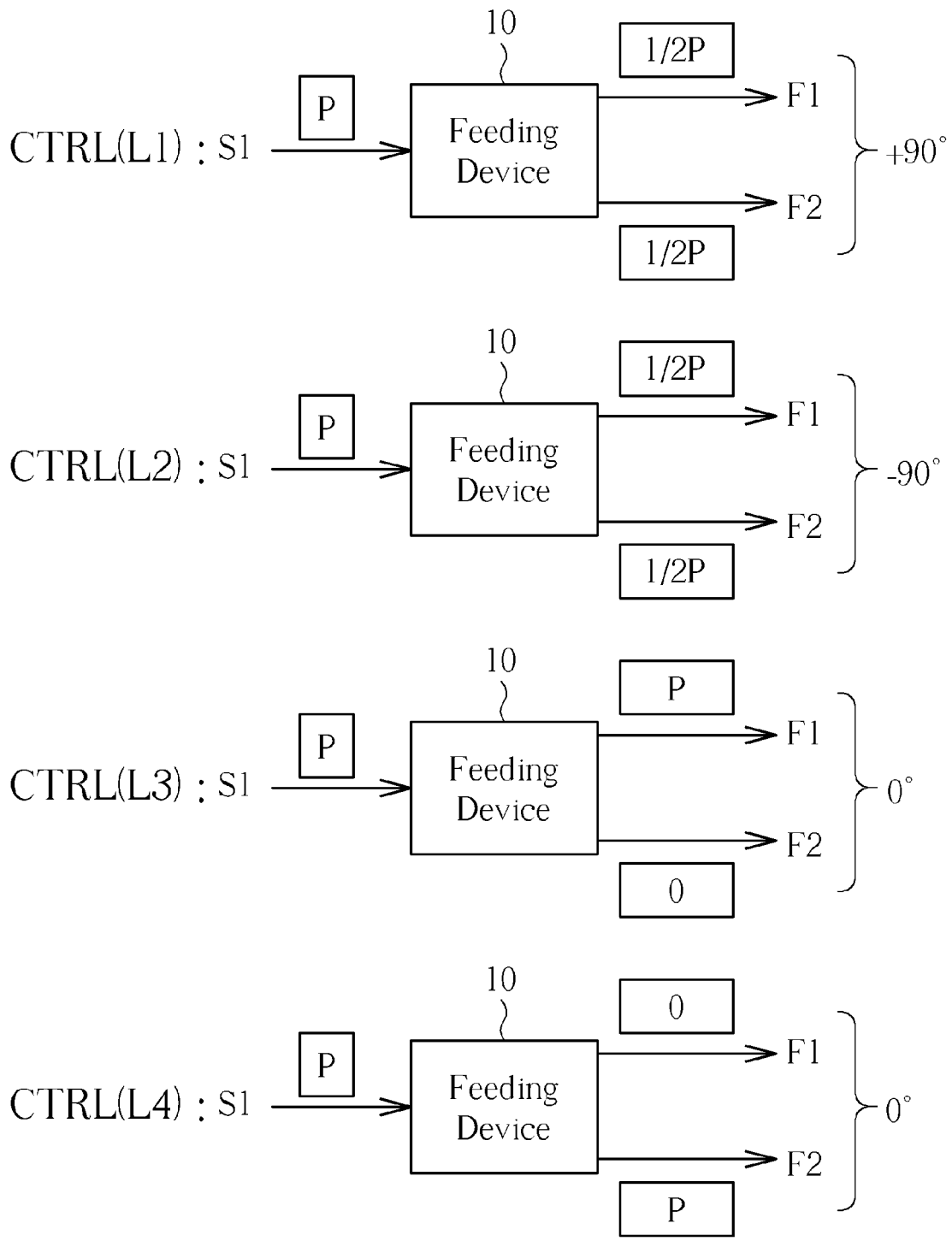
FIG. 1 is an operational diagram of a feeding device for a smart antenna according to the present invention.

Please refer to FIG. 1. FIG. 1 is an operational diagram of a feeding device 10 for a smart antenna according to the present invention. The feeding device 10 can adjust energy ratio and phase difference of output signals according to logic states of a control signal CTRL. For example, the control signal CTRL may include four logic states L1~L4, whereby the feeding device 10 can provide various energy ratio and phase difference of the feeding signals F1 and F2 according to the logic states L1~L4. Assume that P denotes energy of a transmission signal S1, as illustrated in FIG. 1. In the logic state L1, the feeding signals F1 and F2 have equal energy, which are both half energy of the transmission signal S1, and the feeding signal F1 has a 90-degree phase lead to the feeding signal F2. In the logic state L2, the feeding signals F1 and F2 also have equal energy, which are both half energy of transmission signal S1, and the feeding signal F1 has a 90-degree phase lag behind the feeding signal F2. In the logic state L3, the feeding signal F1 has energy equal to the transmission signal S1, and the feeding signal F2 has zero energy. In the logic state L4, the feeding signal F2 has energy equal to the transmission signal S1, and the feeding signal F1 has zero energy.

Hence, if the feeding device 10 are arranged with appropriate antennas, such as the feeding signals F1 and F2 are each coupled to a vertical polarization antenna and a horizontal polarization antenna, for example, radiation electric fields of various polarization directions including horizontal linear polarization, vertical linear polarization, right-hand circular polarization, and left-handed circularly polarization can be formed by the antennas. About detailed operations of the feeding device 10, please continue to refer to the following illustrations.

Figure 2:
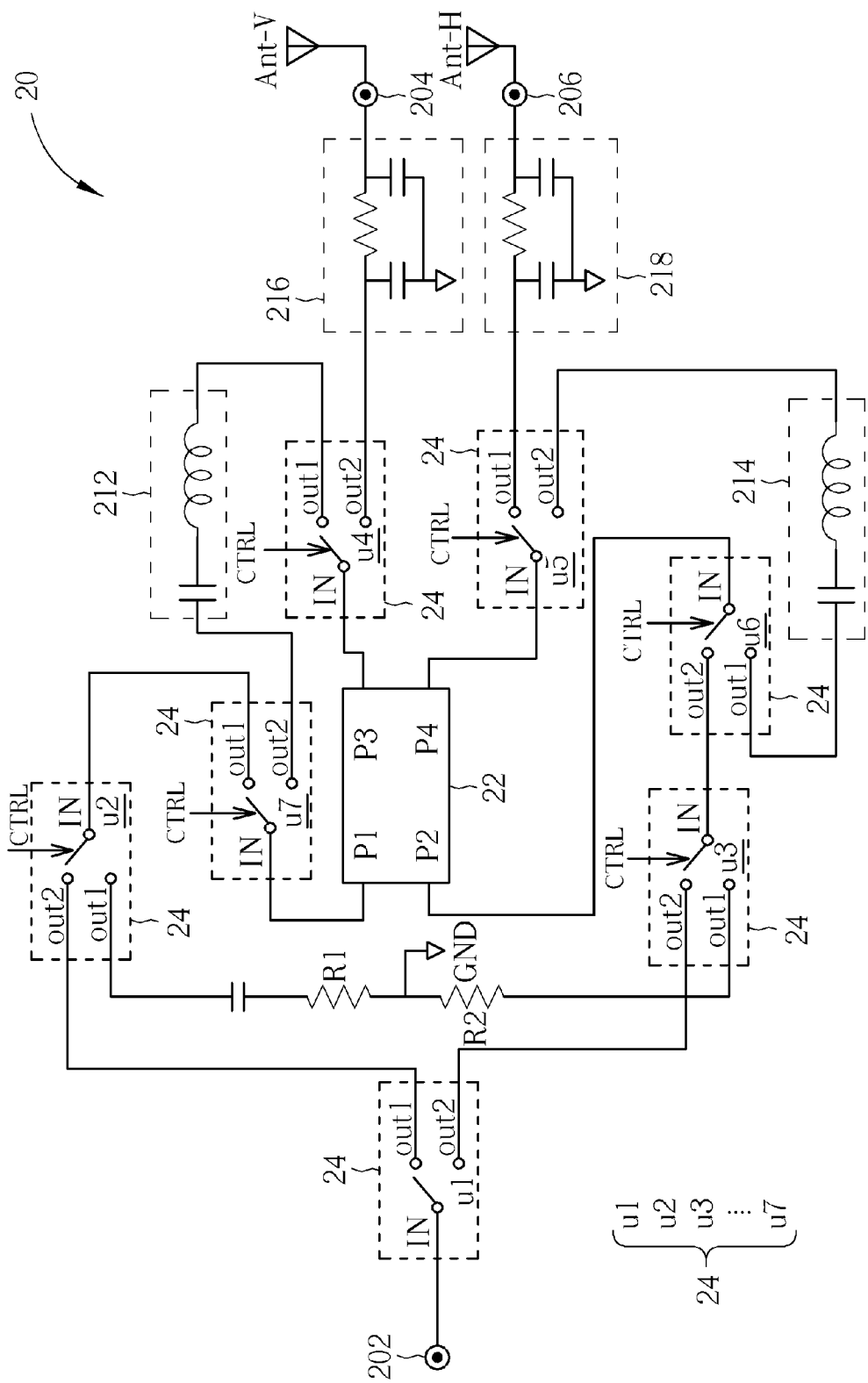
FIG. 2 is a schematic diagram of a feeding device according to an embodiment of the present invention.

Please refer to the FIG. 2. FIG. 2 is a schematic diagram of a feeding device 20 according to an embodiment of the present invention. The feeding device 20 includes a signal reception terminal 202, a first antenna feeding terminal 204, a second antenna feeding terminal 206, a first impedance R1, a second impedance R2, a power divider 22, and a switching circuit 24. The signal reception terminal 202 is utilized for receiving the transmission signal S1. The first antenna feeding terminal 204 and the second antenna feeding terminal 206 are utilized for outputting feeding signals F1, F2 of a vertical polarization antenna Ant_V and a horizontal polarization antenna Ant_H, respectively. The power divider 22 is a 3 dB broadband directional coupler, and has a first input port p1, a second input port p2, a first output port p3, and a second output port p4. Please note that p1, p2, p3 and p4 may be bi-directional ports. In other words, p1 and p2 can also be output ports according to another embodiment of the present invention, while p3 and p4 can also be input ports according to yet another embodiment of the present invention. Energy received by the first input port p1 or the second input port p2 would be equally distributed into the first output port p3 and the second output port p4, and signals of the first output port and the second output port have a 90-degree phase difference. The switching circuit 24 consists of switches u1~u7, and is utilized for performing switching operations according to a control signal CTRL. The switches u1~u7 are each a single pole double throw (SPDT) microwave switch, which has one input terminal (denoted by IN) and two output terminals (denoted by out1 and out2).

In addition, the feeding device 20 further includes resonant circuits 212 and 214. The resonant circuit 212 is coupled between the output terminal out1 of the switch u4 and the output terminal out2 of the switch u7; the resonant circuit 214 is coupled between the output terminal out2 of the switch u5 and the output terminal out1 of the switch u7. The resonant circuits 212 and 214 increase the energy ratio transferred from the input port to the output port when the power divider 22 acts as a two-port transmission component, i.e., when the first output port p3 is reversely coupled to the first input port p1, or when the second output port p4 is reversely coupled to the second input port p2.

The feeding device 20 further includes matching circuits 216 and 218. The matching circuit 216 is coupled between the output terminal out2 of the switch u4 and the first antenna feeding terminal 204; the matching circuit 218 is coupled between the output terminal out1 of the switch u5 and the second antenna feeding terminal 206. The matching circuits 216 and 218 provide impedance matching between the feeding network and the antennas Ant_V, Ant_H to reduce energy loss of the feeding signals F1 and F2. Besides, the first and second impedance R1, R2 are also utilized for impedance matching.

Figure 3:
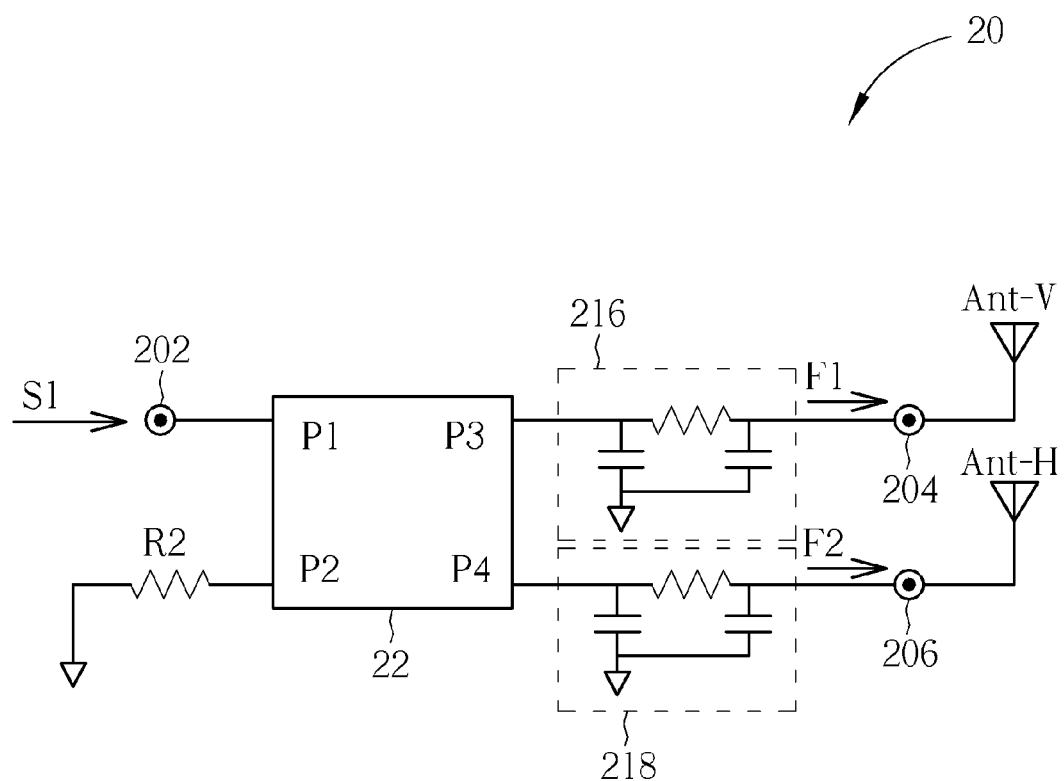
FIG. 3 to FIG. 6 illustrates equivalent circuits of the feeding device of FIG. 2 in different logic states, respectively.

When the control signal CTRL is in the logic state L1, the switching circuit 24 would couple the first input port p1 to the signal reception terminal 202, the second input port p2 to the second impedance R2, the first output port p3 to the first antenna feeding terminal 204, and the second output port p4 to the second antenna feeding terminal 206, such that the output signals of the first output port p3 and the second output port p4 are of equal energy and the output signal of the first output port p3 has a 90-degree phase lead to the output signal of the second output port p4. As a result, the horizontal and vertical polarization antennas Ant_H, Ant_V would generate a radiation field of right-handed circular polarization. As for the equivalent circuit of the feeding device 20 in the logic state L1, please refer to FIG. 3. In FIG. 3, the connection states of the switches u1~u7 are as follows: u1→out1, u2→out2, u3→out1, u4→out2, u5→out1, u6→out2, u7→out1.

Figure 4:
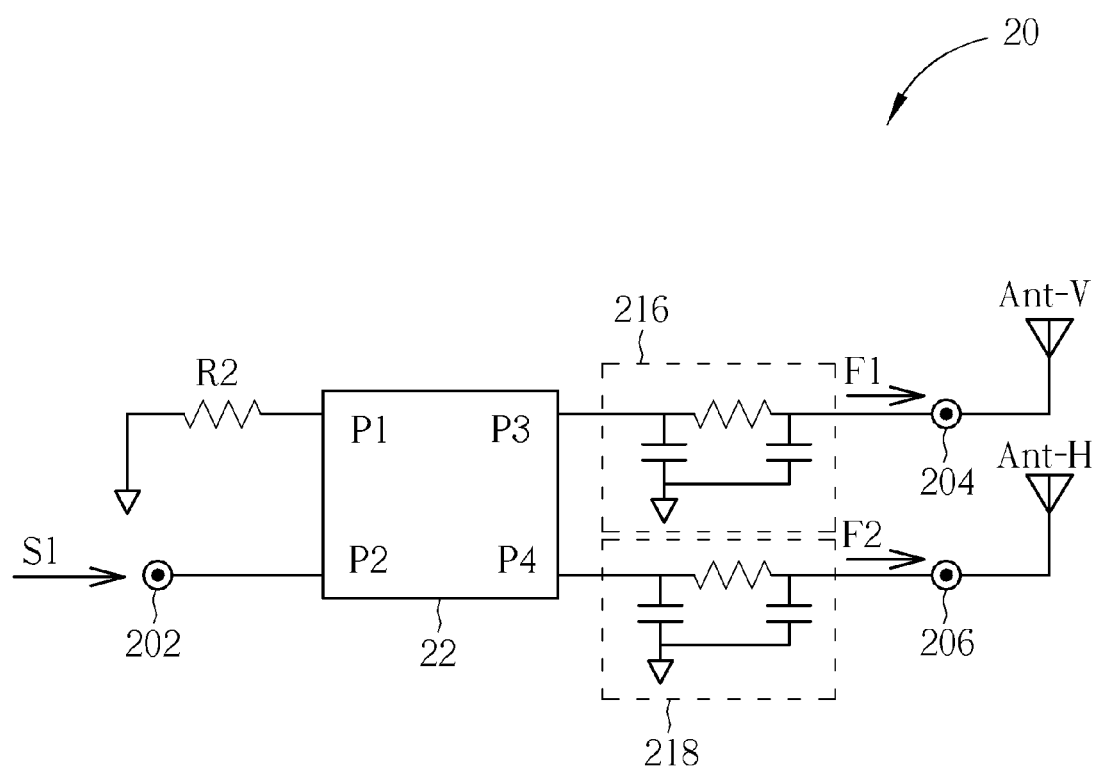

When the control signal CTRL is in the logic state L2, the switching circuit 24 would couple the first input port p1 to the first impedance R1, the second input port p2 to the signal reception terminal 202, the first output port p3 to the first antenna feeding terminal 204, and the second output port p4 to the second antenna feeding terminal 206, such that the output signals of the first output port p3 and the second output port p4 are of equal energy and the output signal of the first output port p3 has a 90-degree of phase lag behind the output signal of the second output port p4. As a result, the horizontal and vertical polarization antennas Ant_H, Ant_V would generate a radiation field of left-handed circular polarization. As for the equivalent circuit of the feeding device 20 in the logic state L2, please refer to FIG. 4. In FIG. 4, the connection states of the switches u1~u7 are as follows: u1→out2, u2→out1, u3→out2, u4→out2, u5→out1, u6→out2, u7→out1.

Figure 5:
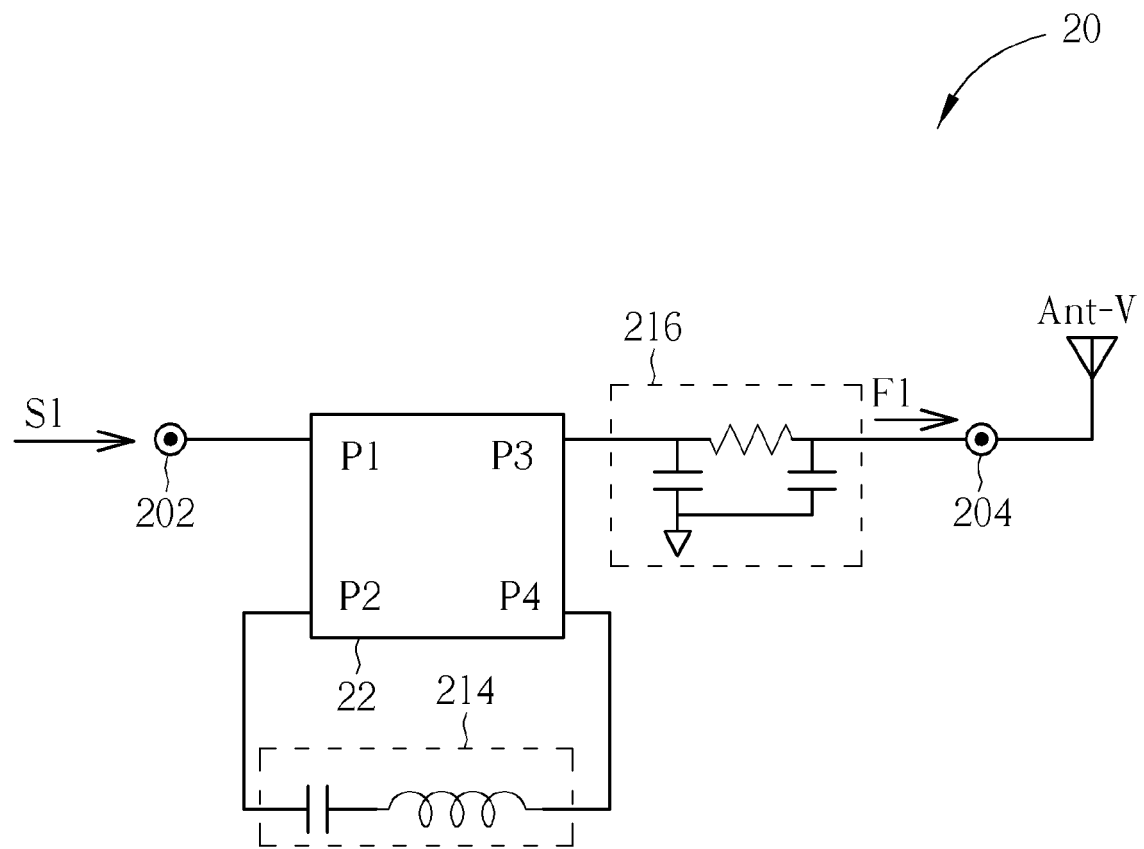

When the control signal CTRL is in the logic state L3, the switching circuit 24 would couple the first input port p1 to the signal reception terminal 202, the second input port p2 to the second output port p4, and the first output port p3 to the first antenna feeding terminal 204, such that the first output port p3 has energy approximately equal to the first input port p1, and the second output port p4 has zero energy. Under this condition, since the horizontal polarization antenna Ant_H does not work anymore, only the vertical polarization antenna Ant_V generates a radiation field of vertical linear polarization. As for the equivalent circuit of the feeding device 20 in the logic state L3, please refer to FIG. 5. In FIG. 5, the connection states of the switches u1~u7 are as follows: u1→out1, u2→out2, u3→out1, u4→out2, u5→out2, u6→out1, u7→out1.

Figure 6:
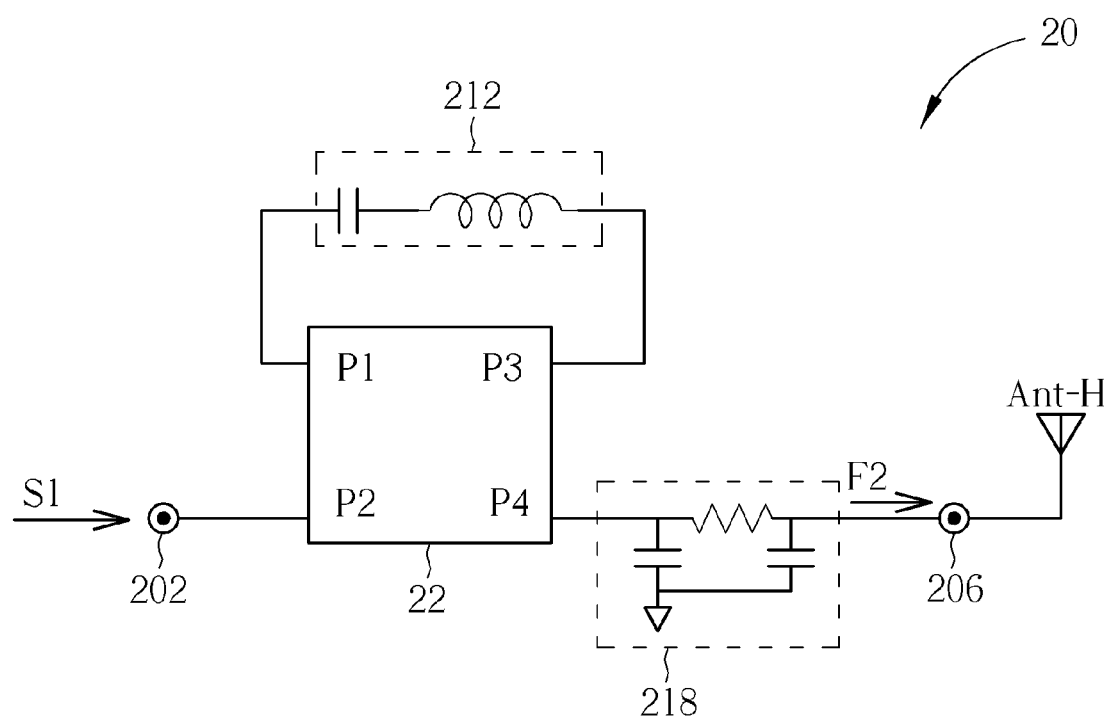

When the control signal CTRL is in the logic state L4, the switching circuit 24 would couple the first input port p1 to the first output port p3, the second input port p2 to the signal reception terminal 202, and the second output port p4 to the second antenna feeding terminal 206, such that the second output port p4 has energy approximately equal to the second input port p2, and the first output port p3 has zero energy. Under this condition, since the vertical polarization antenna Ant_V does not work anymore, only the horizontal polarization antenna Ant_H generates a radiation field of horizontal linear polarization. As for the equivalent circuit of the feeding device 20 in the logic state L4, please refer to FIG. 6. In FIG. 6, the connection states of the switches u1~u7 areas follows: u1→out2, u2→out1, u3→out2, u4→out1, u5→out1, u6→out2, u7→out2.

In short, in the embodiment of the present invention, the feeding device 20 adjusts the energy ratio and the phase difference outputted to the vertical and horizontal polarization antennas Ant_V, Ant_H according to the logic state of the control signal CTRL. Thus, the vertical and horizontal polarization antenna Ant_V, Ant_H would generate the radiation fields of various polarization directions including horizontal linear polarization, vertical linear polarization, right-hand circular polarization, and left-handed circularly polarization.

For example, when the feeding device 20 is applied to a wireless communication product, the feeding device 20 can be disposed between a radio-frequency (RF) signal processing circuit and two linear polarization antennas with polarization directions orthogonal to each other. That is to say, the signal reception terminal 202 is coupled to the RF signal processing circuit, and the antenna feeding terminals 204 and 206 are coupled to the two linear polarization antennas. Therefore, according to the logic state of the control signal CTRL, the feeding device 20 can distribute energy of the transmission signal S1 outputted from the RF signal processing circuit into the antenna feeding terminals 204 and 206, and adjust phase difference thereof to generate the radiation fields of various polarization directions.

Please note that, the feeding device 20 of FIG. 2 is only an exemplary embodiment of the present invention, and appropriate modifications can certainly be made by those skilled in the art according to actual requirements. For example, the switching circuit 24 can also be implemented by signal pole triple throw (SP3T) microwave switches, which is still in the scope of the present invention. Preferably, the power divider 22 can be implemented by the power splitter of TW Patent Application No. 098121177, but is not limited to this.

To sum up, in the present invention, only one feeding network is used to achieve four kinds of signal outputs, and thereby a smart antenna can generate the radiation fields of various polarization directions. Compared to the prior art that needs four feeding networks, the size of printed circuit board required by the feeding network is decreased substantially, and layout complexity of the printed circuit board is reduced as well. Meanwhile, with appropriate antenna arrangements, the overall size of the wireless module can also be reduced significantly.

Those skilled in the art will readily observe that numerous modifications and alterations of the device and method may be made while retaining the teachings of the invention.

What is claimed is:

1. A feeding device for a smart antenna, the feeding device comprising:
   a signal reception terminal, for receiving a transmission signal;
   a first antenna feeding terminal, for outputting a first feeding signal to a first antenna;
   a second antenna feeding terminal, for outputting a second feeding signal to a second antenna;
   a first impedance;
   a second impedance;
   a power divider, having a first input port, a second input port, a first output port, and a second output port, for distributing energy received by the first input port or the second input port equally to the first output port and the second output port, and making signals of the first output port and the second output port have 90 degree phase difference; and
   a switching circuit, for switching connection states between the power divider and each one of the signal reception terminal, the first antenna feeding terminal, the second antenna feeding terminal, the first impedance and the second impedance according to a control signal.

2. The feeding device of claim 1, wherein the first antenna feeding terminal is a vertical polarization antenna, and the second feeding terminal is a horizontal polarization antenna.

3. The feeding device of claim 1, wherein the switching circuit comprises:
   a first switch, having an input terminal coupled to the signal reception terminal, a first output terminal, and a second output terminal, for selectively coupling the input terminal to the first output terminal or the second output terminal according to the control signal;
   a second switch, having an input terminal, a first output terminal coupled to the first impedance, and a second output terminal coupled to the first output terminal of the first switch, for selectively coupling the input terminal to the first output terminal or the second output terminal according to the control signal;
   a third switch, having an input terminal, a first output terminal coupled to the second impedance, and a second output terminal coupled to the second output terminal of the first switch, for selectively coupling the input terminal to the first output terminal or the second output terminal according to the control signal;
   a fourth switch, having an input terminal coupled to the first output port of the power divider, a first output terminal, and a second output terminal coupled to the first antenna feeding terminal, for selectively coupling the input terminal to the first output terminal or the second output terminal according to the control signal;
   a fifth switch, having an input terminal coupled to the second output port of the power divider, a first output terminal coupled to the second antenna feeding terminal, and a second output terminal, for selectively coupling the input terminal to the first output terminal or the second output terminal according to the control signal;
   a sixth switch, having an input terminal coupled to the second input port of the power divider, a first output terminal coupled to the second output terminal of the fifth switch, and a second output terminal coupled to the input terminal of the third switch, for selectively coupling the input terminal to the first output terminal or the second output terminal according to the control signal; and
   a seventh switch, having an input terminal coupled to the first input terminal of the power divider, a first output terminal coupled to the input terminal of the second switch, and a second output terminal coupled to the first output terminal of the fourth switch, for selectively coupling the input terminal to the first output terminal or the second output terminal according to the control signal.

4. The feeding device of claim 3, wherein the first to the seventh switches are all single pole double throw (SPDT) microwave switches.

5. The feeding device of claim 3 further comprising a resonant circuit, coupled between the first output terminal of the fourth switch and the second output terminal of the seventh switch.

6. The feeding device of claim 3 further comprising a resonant circuit, coupled between the second output terminal of the fifth switch and the first output terminal of the seventh switch.

7. The feeding device of claim 3 further comprising a matching circuit, coupled between the second output terminal of the fourth switch and the first antenna feeding terminal.

8. The feeding device of claim 3 further comprising a matching circuit, coupled between the first output terminal of the fifth switch and the second antenna feeding terminal.

9. The feeding device of claim 1, wherein the switching circuit couples the first input port to the signal reception terminal, the second input port to the second impedance, the first output port to the first antenna feeding terminal, and the second output port to the second antenna feeding terminal according to the control signal.

10. The feeding device of claim 9, wherein the first feeding signal and the second feeding signal have equal energy, and the first feeding signal has 90 degrees of phase leading to the second feeding signal.

11. The feeding device of claim 1, wherein the switching circuit couples the first input port to the first impedance, the second input port to the signal reception terminal, the first output port to the first antenna feeding terminal and the second output port to the second antenna feeding terminal according to the control signal.

12. The feeding device of claim 11, wherein the first feeding signal and the second feeding signal have equal energy, and the first feeding signal has 90 degrees of phase lagging to the second feeding signal.

13. The feeding device of claim 1, wherein the switching circuit couples the first input port to the signal reception terminal, the second input port to the second output port, and the first output port to the first antenna feeding terminal according to the control signal.

14. The feeding device of claim 13, wherein energy of the first feeding signal is substantially equal to that of the transmission signal, and energy of the second feeding signal is zero.

15. The feeding device of claim 1, wherein the switching circuit couples the second input port to the signal reception terminal, and the second output port to the second antenna feeding terminal according to the control signal.

16. The feeding device of claim 15, wherein energy of the second feeding signal is substantially equal to that of the transmission signal, and energy of the second feeding signal is zero.

17. The feeding device of claim 1, wherein the power divider is a broadband directional coupler.

* * * * *